United States Patent [19]

Weinstein et al.

[11] 3,990,914
[45] Nov. 9, 1976

[54] TUBULAR SOLAR CELL

[75] Inventors: Harold Weinstein, Sherman Oaks; Ray H. Lee, Calabasas, both of Calif.

[73] Assignee: Sensor Technology, Inc., Chatsworth, Calif.

[22] Filed: Sept. 3, 1974

[21] Appl. No.: 502,272

[52] U.S. Cl. ................................. 136/89; 29/572; 126/270; 126/271; 427/75; 427/86; 148/174; 148/1.5; 156/610
[51] Int. Cl.² ..................... H01L 31/04; F24J 3/02; H01L 7/36; B05D 5/12
[58] Field of Search .................. 136/89; 250/211 J; 357/20, 30

[56] References Cited
UNITED STATES PATENTS

| | | | |
|---|---|---|---|
| 866,462 | 9/1907 | Hammer | 136/89 |
| 2,083,317 | 6/1937 | Dallenbach | 136/89 |
| 2,506,625 | 5/1950 | Woolley | 136/89 |
| 2,847,585 | 8/1958 | Christian | 136/89 |
| 2,946,945 | 7/1960 | Regnier | 320/2 |
| 3,117,295 | 1/1964 | Luft | 338/19 |
| 3,134,906 | 5/1964 | Henker | 250/211 J |

*Primary Examiner*—John H. Mack
*Assistant Examiner*—Aaron Weisstuch
*Attorney, Agent, or Firm*—Flam & Flam

[57] ABSTRACT

High efficiency, low cost solar energy conversion is facilitated by using tubular photovoltaic solar cells situated at the focus of a line-generated paraboloidal reflector. Advantageously, each solar cell comprises a pair of concentric glass tubes that are hermetically sealed at the ends. A photovoltaic junction is formed over the entire inside surface of one of the concentric tubes. For example, this may comprise an inner electrically conductive film, contiguous layers of $Cu_2S$ and CdS forming a heterojunction, and an outer film of optically transparent but electrically conductive material. The conductive films provide electrical connection to the junction via external contacts that are symmetrically disposed at the ends of the tubular cell.

In other embodiments the photovoltaic junction is formed in a crystalline silicon layer that is grown in situ on one of the glass tubes. Techniques for promoting oriented semiconductor crystalline growth are disclosed. These include providing minute crystalline islands in a metal matrix to serve as growth centers, surface alignment using a wavy layer deposited at an acute angle onto the glass substrate, surface seeding and normalization growth atop a fluid-like thin film deposition substrate.

31 Claims, 13 Drawing Figures

TUBULAR SOLAR CELL

BACKGROUND OF THE INVENTION

1. Field of the Invention

The present invention relates to a solar cell of tubular configuration and to techniques for fabricating the same.

2. Description of the Prior Art

In an era of increasing energy consumption, dwindling fossil fuel supplies and concern for the environment, solar radiation represents a potential source of energy which is non-polluting and does not deplete natural resources. The problem is one of efficient, low-cost conversion of sunlight to a readily usable form. Solar photovoltaic conversion offers this possibility, and it is a principal object of the present invention to provide a photovoltaic solar cell for converting sunlight to electrical energy efficiently and economically.

Photovoltaic solar cells per se are known. They have been used with considerable success as a power source in space vehicles where advantage is taken of the high vacuum conditions beyond the earth's atmosphere. For example, cadmium sulfide - copper sulfide photovoltaic heterojunction cells operate without degradation for long periods of time in such space vacuum conditions.

Adaptation of such photovoltaic cells for terrestrial use has several problems. First, if the cadmium sulfide - copper sulfide junction material is exposed to the atmosphere, oxidation and other reactions occur causing relatively rapid degradation of cell performance. Thus hermetic packaging must be provided. But this is compounded by the second problem, which is that very large cell area is required to harness economically significant amounts of energy. Thus while hermetic packaging of small, individual cells of a few square centimeters is readily achieved, extension of such techniques to cell areas of many meters has not been practical. Another object of this invention is to provide a photocell packaging technique permitting large area implementation at low cost.

Solar energy conversion also can be achieved with silicon or other semiconductor junction photovoltaic cells. However, such cells require substantially single crystal semiconductor material for optimum efficiency. The growth of such crystalline material in areas large enough for commercial solar energy conversion has not been achieved. A recent technique called edge-defined film-fed growth offers promise for growth of long ribbons of semiconductor material. A further object of the present invention is to provide techniques for semiconductor photovoltaic cell construction in which oriented semiconductor crystalline growth over large areas is promoted by appropriate surface preparation of the supporting structure.

Another problem of terrestrial solar energy conversion relates to concentration of sunlight onto the cells to obtain maximum efficency. Large flat arrays use only the direct sunlight and do not permit such concentration, and suffer the further disadvantage that replacement of individual cells in the array is difficult. Situating the photocell at the focus of a parabolic reflector provides excellent concentration, but the cell area is severely limited, so that the overall amount of obtained electrical energy is not great. Another object of the present invention is to provide a unique tubular photocell configuration and an associated reflector of line generated paraboloid geometry. This combination permits implementation of large area solar cell arrays having the attendant efficiency gain benefit of light concentration from the paraboloid reflector. Replacement of individual cells, should this be required, is simplified by providing symmetric electrical contacts at each end of the tubular cell.

SUMMARY OF THE INVENTION

These and other objects are achieved by providing a solar photovoltaic cell of tubular configuration, adapted for use with a reflector of line generated paraboloid configuration. Advantageously the cell consists of a pair of elongated coaxial glass tubes hermetically sealed at the ends, and having an external appearance similar to a conventional fluorescent light bulb. The photovoltaic junction and its associated electrical contacts are disposed as films or thin layers on an interior surface within the hermetically sealed annular space between the concentric tubes.

In one embodiment the junction consists of a metal film electrical contact disposed on the outer surface of the inner glass tube, contiguous layers of copper sulfide and cadmium sulfide atop the metal film to form the photovoltaic heterojunction, and a thin, optically transparent but electrically conductive metal layer atop the junction to serve as the other contact. External electrical connections are accomplished by metal islands or leads extending through the end seals and connected to the respective metal films. These external connections preferably are symmetrically duplicated at each end of the tubular cell so that correct electrical connection will be achieved even if the cell is installed "backwards".

A semiconductor photovoltaic junction may be employed in the inventive tubular solar cell. Several techniques are set forth for promoting oriented crystalline semiconductor growth on one of the glass tubes. In a preferred technique a thin layer or film of aluminum is deposited onto the tube, followed by deposition of some silicon. The structure is heated to the aluminum-silicon entectic temperature (appoximately 477° C.) which is below the melting point of glass, then quickly cooled by between about 50° C. and 100° C. This "supper cools" the entectic, causing the silicon to separate into individual cyrstalline islands in the aluminum matrix. Subsequently silicon is vapor deposited onto this matrix. The crystal islands serve as growth centers for the newly deposit silicon, promoting oriented crystalline growth thereof. A p-n junction may be formed in the crystalline silicon layer either during or subsequent to its growth.

Other techniques for promoting oriented semiconductor crystal growth include, among other (a) seeding the glass surface with minute silicon particles (b) depositing silicon oxide or other compound onto the glass at an acute angle to create a wavy surface, and (c) providing an amorphous, liquid-like deposition surface on which the deposited silicon will cyrstallize normal to the surface since no other orientation is induced by the ultra-smooth surface.

BRIEF DESCRIPTION OF THE DRAWINGS

A detailed description of the invention will be made with reference to the accompanying drawings wherein like numerals designate corresponding elements in the several figures.

DESCRIPTION OF THE PREFERRED EMBODIMENTS

The following detailed description is of the best presently contemplated modes of carrying out the invention. This description is not to be taken in a limiting sense, but is made merely for the purpose of illustrating the general principles of the invention since the scope of the invention best is defined by the appended claims.

Operational characteristics attributed to forms of the invention first described also shall be attributed to forms latter described, unless such characteristics obviously are inapplicable or unless specific exception is made.

Figures 1, 2, 2A:
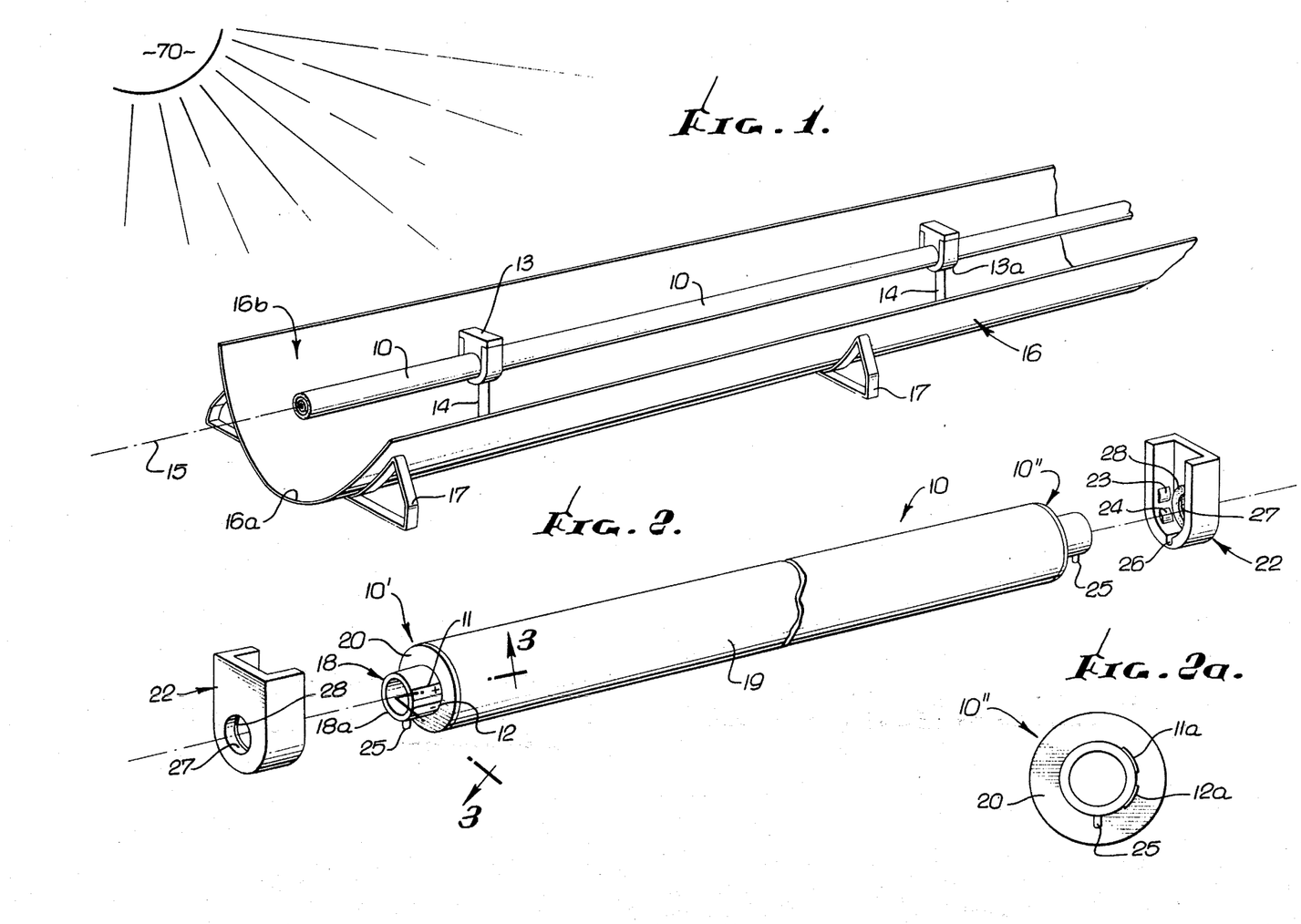
FIG. 1 is a pictorial view of the inventive tubular solar cell together with its line generated paraboloid reflector.
FIGS. 2 and 2a are respectively perspective and end views of an illustrative tubular solar cell and sockets for mounting the same.

In FIGS. 1 and 2, the inventive solar cell 10 is of elongated, tubular configuration with a pair of electrical contacts 11, 12 and 11a, 12a at each end 10', 10''. The tubular cells 10 are supported at the ends by appropriate receptacles 13, 13a mounted on stanchions 14. The tubular cells 10 thus are disposed along a common axis 15 that is at the focus of a line generated paraboloid reflector 16. The reflector 16 itself may be supported on the ground by braces 17 with its opening 16b facing the sun 70. The inner surface 16a of the reflector 16 preferably is mirrored, as by a coating of silver or other reflective metal.

The reflector 16 functions to concentrate solar radiation on the tubular cell 10. Preferably light reflected by the concentrator 16 strikes the tubular cells 10 around more than 180° of their periphery. With such a concentrating angle, the concentrated radiation received by the cells 10 per unit length is over twice that of the radiation power received by a planar cell of corresponding area. Indeed, the actual radiation power received by the tubular cells 10 is even greater, since the cells also receive direct radiation from the sun without reflection back from the concentrator 16.

As shown in FIGS. 2 and 2A, the electrical contacts 11, 12 and 11a, 12a are disposed symmetrically at opposite ends of the tube 10. The positive contacts 11 and 11a are connected together, as are the negative contacts 12 and 12a. With this symmetric arrangement, the tube 10 can be installed without regard for end orientation. Thus either the end 10a or 10b may be inserted into the receptacle 13a (FIG. 1).

Figure 3:
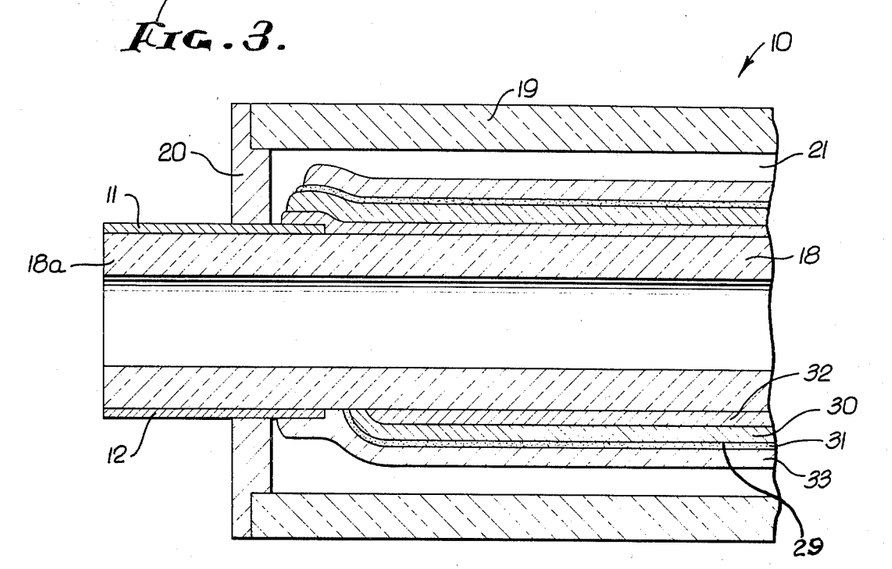
FIG. 3 is a transverse sectional view of the solar cell of FIG. 2 as seen along the line 3—3 thereof; the photovoltaic cell components as shown greatly enlarged and out of proportion for ease of exposition.

In the embodiments of FIGS. 2 and 3, each solar cell 10 consists of a pair of coaxial glass tubes 18, 19 spaced by an annular closure 20 at each end. These closures 20, which advantageously are of glass frit material, serve structurally to support the outer tube 19 and to provide a hermetic seal for the annular space 21 between the concentric tubes 18, 19.

The inner tube 18 is somewhat longer than the outer tube 19 so that its ends 18a project outwardly of the ends seals 20. The contacts 11, 12, 11a, 12a advantageously comprise thick metal layers disposed on the outer surface of the tube 18, extending past the seals 20 into the annular region 21.

The tubular cell 10 may be received by sockets 22 each having a generally U-shaped recess to receive a tube end 18a. Resilient metal fingers 23, 24 provide electrical connection to the contacts 11, 12 or 11a, 12a. To insure proper contact alignment with these fingers 23, 24 the tube end 18a may be provided with a projection or key 25 that seats in corresponding recess 26 in the socket 22. Of course, the invention is by no means limited to the specific contact arrangement illustrated in FIG. 2. Other contact means may be employed with the inventive solar cell.

The ends of the inner glass tube 18 may be plugged, or these ends may be left open as shown in FIGS. 2 and 3. The associated sockets 22 may have corresponding openings 27 and fluid seals 28 to facilitate the circulation of a coolant fluid through the interior of the solar cells 10. This has the double benefit of cooling the cells themselves, while providing a source of thermal energy in the form of the heated fluid.

In the embodiment of FIG. 3, the photovoltaic junction 29 consists of an active layer 30 of copper sulfide ($Cu_2S$) covered by a barrier layer 31 of cadmium sulfide (CdS). A first electrical contact to the junction 29 consists of an electrically conductive oxide film 32 disposed on the outer surface of the inner glass tube 18. Typically, this conductive film 32 consists of a mixture of tin oxide and indium oxide having a resistance of at least 10 ohms per square centimeter. The film 32 overlaps the metal land forming the positive contact 11. The other contact 33 to the junction 29 consists of an optically transparent but electrically conductive layer disposed atop the CdS layer 31. This conductive layer 33 may comprise a mixture of tin oxide and indium oxide having an optical transmissivity of at least 90% and an electrical resistivity of 10 ohms per square inch or less. The layer 33 overlaps the metal contact 12 to provide a negative lead for the junction 29.

In a typical embodiment, the inner glass tube 18 may have a wall thickness of about 1/16 inch, a diameter of 1 inch, and a length of 4 feet. Such a glass tubing has a effective area of approximately 1 square foot. The photocell layers 30 through 33 may be sequentially vacuum deposited onto the glass tubing 18. Sputtering, vapor deposition or other known application techniques may be employed. Typically the electrically conductive films 32, 33 each may have a thickness on the order of 10 microns. The $Cu_2S$ active layer 30 typically may be 10 to 20 microns thick, while the CdS barrier layer 31 may be 1 micron thick and doped for low resistivity. Since this layer 31 is extremely thin, only a small amount of the relatively costly cadmium sulfide material is employed, thereby minimizing cell cost. Since the photovoltaic junction 29 is completely contained within the hermetically sealed space 21, the junction is not degraded as would otherwise occur if it were directly exposed to the terrestrial environment.

Figure 4:
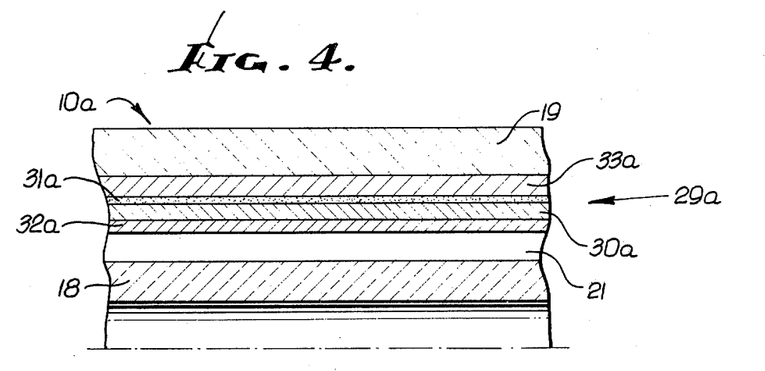
FIG. 4 is a fragmentary sectional view of another tubular solar cell in which the photovoltaic cell layers (shown greatly enlarged) are disposed on the outer glass tube.

In the alternative embodiment 10a of FIG. 4, the photovoltaic heterojunction 29a is deposited on the inside surface of the outer glass tube 19. In this case, the conductive film 33a is deposited first on the glass 19, followed in succession by the CdS layer 31a, the $Cu_2S$ layer 30a and the positive electrical contact layer 32a.

Figure 5:
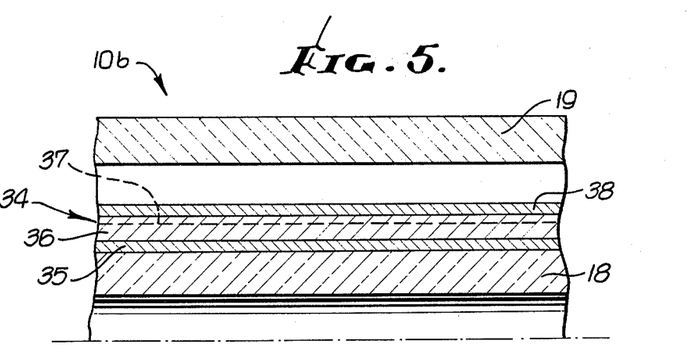
FIG. 5 is a fragmentary sectional view, not to scale, of a tubular solar cell embodiment employing a semiconductor junction.

In the alternative tubular solar cell 10b of FIG. 5, a semiconductor junction 34 is used as the photovoltaic component. To this end, an electrically conductive film 35 is provided on the outer surface of the inner glass tube 18. Advantageously, but not necessarily this film 35 itself may play a roll in promoting the oriented crystalline growth of a semiconductor layer 36 disposed above the film 35. The semiconductor material 36 preferably exhibits oriented crystalline properties so that an efficient p-n junction 37 may be formed therein. The semiconductor layer 36 is covered by a thin optically transparent but electrically conductive film 38 which, together with the conductor 35, provides electrical connection to the photovoltaic junction 34.

Figure 6:
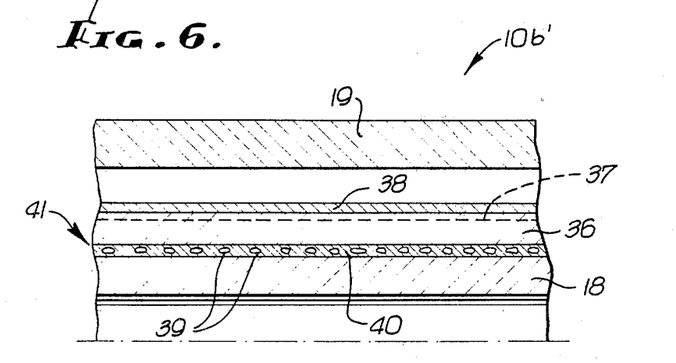
FIG. 6 is a sectional view of a solar cell like that of FIG. 5 showing the use of minute crystalline semiconductor islands in a metal matrix for promoting oriented crystalline growth of an overlying semiconductor layer.

A preferred method for growing the semiconductor layer 36 and forming the photovoltaic junction 34 is illustrated in FIG. 6. In this technique, the glass tube 18 first is coated with a layer of aluminum that is sprayed on or applied by wet chemical evaporation. A small amount of semiconductor silicon next is deposited atop the aluminum by a similar technique. The silicon so deposited need not be crystalline. The resultant structure is heated together to approximately the aluminum-silicon eutectic temperature of 477° C. This temperature is below the melting point of the glass. An aluminum-silicon eutectic layer is formed aptop the glass. The temperature then is lowered quickly by about between 50° C. and 100° C. (i.e. to between about 427° C. to 377° C.) to produce a "super cooled" eutectic. The silicon separates from the aluminum and crystalizes to form tiny islands 39 (FIG. 6) of crystalline silicon within the aluminum film 40.

The resultant matrix 41 plays two roles. First, the tiny crystalline silicon islands 39 in the matrix 41 promote oriented crystalline growth of the semiconductor layer 36. Secondly, the aluminum film 40 in the matrix 41 functions as an electrical conductor to the semiconductor junction 37 in the device 10b'.

To grow the semiconductor layer 36, silane or other gaseous silicon source is vapor deposited onto the matrix 41 (FIG. 6). As the silicon deposits it crystalizes in situ. Oriented crystalline growth is promoted by the silicon islands 39 which serve as growth centers. The resultant semiconductor layer 36, while probably not a single crystal, has a sufficiently oriented crystalline structure to achieve good device performance.

To produce the junction 37, n- or p-type dopants may be introduced into the silicon layer 36 as it is being grown. For example, during the initial portions of this growth, n-type dopant material may be introduced in vapor form together with the silane or other silicon source. The resultant silicon layer will be of n-type conductivity. Subsequently, a p-type dopant material may be introduced with the silane to produce an overlaying region of p-type conductivity silicon. The junction 37 is at the interface of these two regions. Finally a thin film 38 of tin oxide and indium oxide may be deposited atop the semiconductor layer 36 to complete fabrication of the photovoltaic junction 34.

Figure 7:
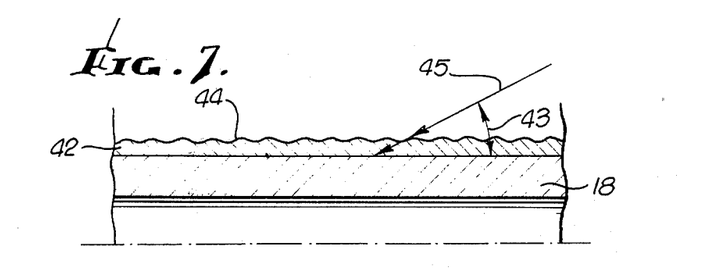
FIG. 7 is a sectional view illustrating the "surface alignment" technique of promoting oriented semiconductor crystalline growth.

Another technique for promoting oriented crystalline semiconductor growth on a glass substrate is illustrated in FIG. 7. In this "surface alignment" technique a thin layer 42 of material is vacuum deposited onto the unheated glass tube 18 at an acute angle 43 typically on the order of 15° to the surface (i.e., about 75° to a normal from the surface of the tube 18). The layer 42 that is formed by such acute angle vacuum deposition will not be flat. Rather, its surface 44 will be wave-like with a pitch of microscopic and perhaps molecular order. If a semiconductor material such as silicon now is vapor deposited atop the layer 42, the wavy surface 44 will promote oriented cyrstalline growth of the deposited semiconductor.

In a preferred embodiment, the material of the layer 42 may comprise a combination of silicon oxide and gold. The deposition is accomplished in a vacuum chamber in which the source material is vaporized and directed in a narrow beam (indicated by the arrow 45 of FIG. 7) at an acute angle 43 toward the surface of the glass tube 18. The tube 18 may be rotated and translated axially during the deposition process to produce an appropriate layer 42 over the entire exterior surface of the tube 18. By including sufficient gold in the deposited material, the layer 42 will be of relatively low electrical resistivity, and hence can serve as the inner electrode for the p-n junction formed in the subsequently grown silicon semiconductor layer. Alternative source materials for the layer 42 include silicon nitride silane and metals.

Another technique (not illustrated) for promoting oriented semiconductor crystalline growth on a glass tube is to coat the glass substrate with minute, dust-sized particles of single crystal silicon. This dust may be prepared by cracking or breaking up a single crystal of silicon into particles on the order of one-tenth mil or less. These particles may be deposited on the cool glass substrate by means of plasma spray. Alternatively, crystalline silicon seeds may be implanted near the surface of the glass tube 18 by ion implantation using a silicon gas source such as silane or silicon iodide.

Yet another technique for promoting oriented crystalline growth involves first coating the glass substrate with a thin layer of aluminum. Then, inside a vacuum chamber, the aluminum coated glass is heated to a temperature somewhat below the aluminum-silicon eutectic temperature of 477° C., but sufficiently high (preferably above about 375° C.) so that the aluminum loses its crystallinity and behaves somewhat like a fluid. The effect is that the aluminum surface is smooth, so that when silicon or other semiconductor material subsequently is deposited atop the aluminum layer, there is no preferred direction for crystallization. As a result, the silicon will start to crystallize in a direction normal to the surface. In other words, the very smooth aluminum surface will promote crystalline growth of the semiconductor film in a symmetrical direction which is normal to the substrate. As before, the deposited silicon may be doped during growth to form the p-n photovoltaic junction. The underlying aluminum layer will serve as the lower electrical contact, and an optically transparent but electrically conductive film may be deposited atop the semiconductor layer to provide the other electrical contact to the junction. the resultant solar cell will have the general characteristics described above in conjunction with FIG. 5.

Figure 8:
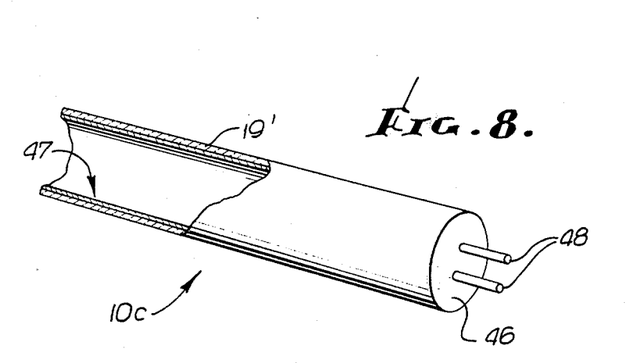
FIG. 8 is a perspective view, partly broken away and in section, of another tubular solar cell embodiment using only a single base tube.

Although the solar cell embodiments described thus far employ a pair of concentric glass tubes, the invention is not so limited. For example, the inner tube need not be glass, but itself could be silicon or other semiconductor material. Even a metal could be used for this inner tube. Still another alternative is shown in FIG. 8. There, the tubular solar cell 10c uses only a single glass tube 19' that is hermetically sealed at the ends by a closure 46. A photovoltaic junction and its associated contacts, together designated 47 in FIG. 8, are formed in a manner hereinbefore described on the inside of the single tube 19'. External electrical connections are facilitated by contacts 48 extending from the end closure 46.

While certain junction materials have been described above, the invention is by no means so limited. For example, in the semiconductor versions, germanium or other semiconductor could be used in place of silicon. Furthermore, photocells of other materials may be used in the inventive tubular configuration. For example, II–VI compounds such as ZnSe, ZnTe, CdS, CdSe and CdTe may be employed. Similarly, III-V compounds such as AlP, AlAs, AlSb, GaN, GaP, GaAs and the like may be used for the photovoltaic layers.

With regard to electrical connection to the inventive tubular solar cell, it is not necessary that both the positive and negative leads be brought out at both ends of the cell. Thus it may be more economical to have only the positive lead at one end and only the negative lead at the other end. Furthermore, the optically transparent outer electrical conductor need not be a continuous film as illustrated. Alternatively this ohmic top layer may comprise a metallic film or wire grid atop the photosensitive junction, as illustrated in FIG. 9.

Figure 9:
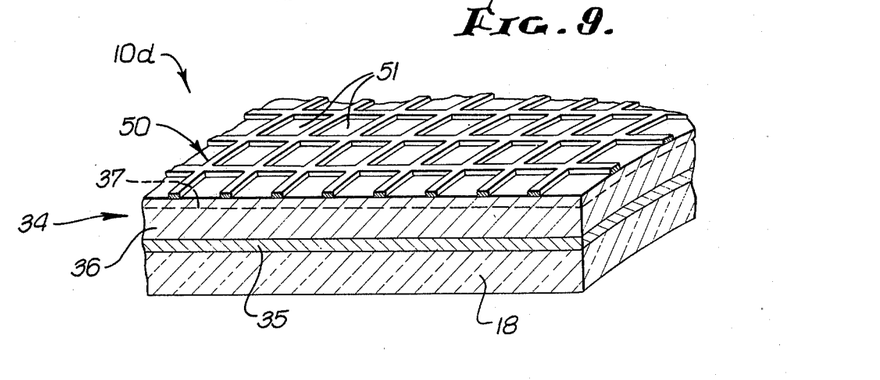
FIG. 9 is a greatly enlarged fragmentary perspective view, partly in section, showing the use of a metal film grid as the outer electrode for the photovoltaic junction in a solar cell.

In FIG. 9, the tubular solar cell 10d employs a semiconductor photovoltaic layer 36 like that of FIG. 5. The outer electrical connection to the layer 36 is a metallic film grid 50 formed by conventional deposition and microphotolithographic techniques. The mesh of the grid 50 is selected so that there is considerable optical transmissivity. That is, a substantial percentage of the incident light will pass through the openings 51 in the grid 50 and reach the photovoltaic layer 36. Although not illustrated, the grid 50 may be employed together with, or embedded within an optically transparent but electrically conductive film such as the film 38 of FIG. 5.

Figure 10:
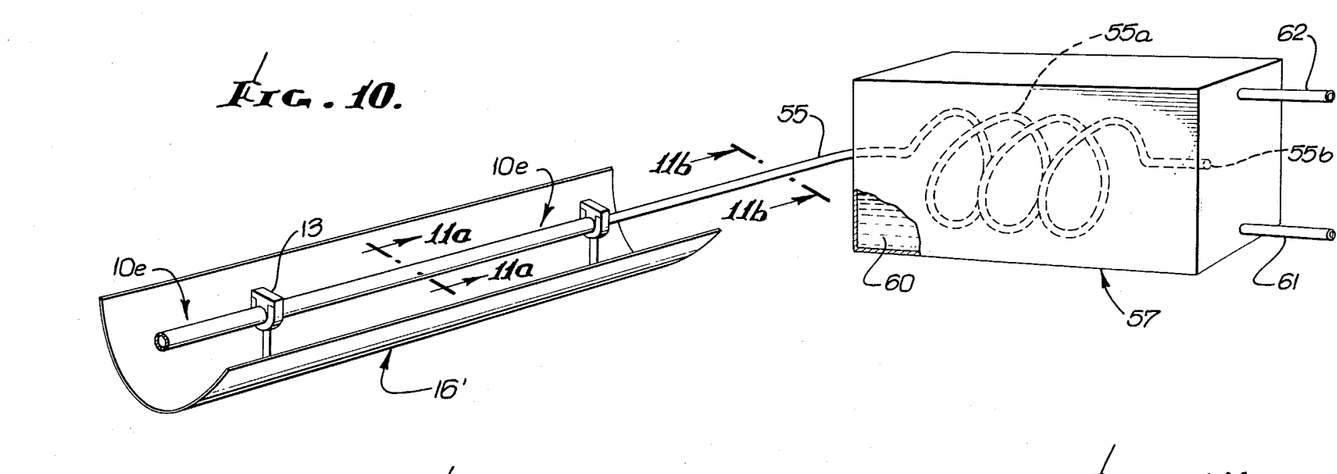
FIG. 10 is a pictorial view of a "heat pipe" embodiment of the inventive solar cell.
Figure 11A:
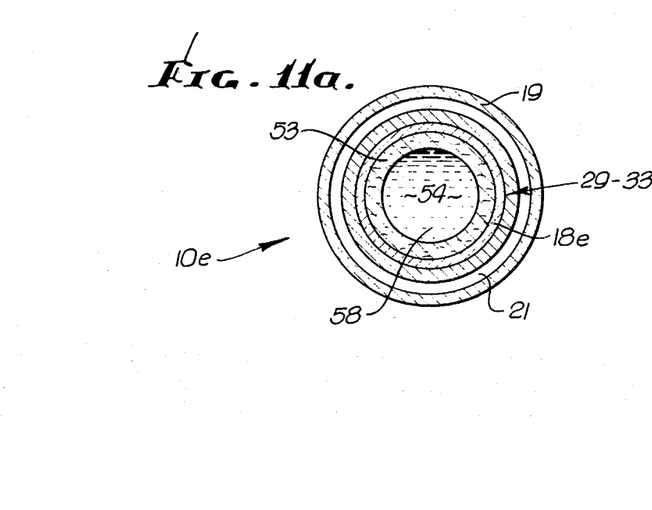
FIGS. 11a and 11b are sectional views of the "heat pipe" embodiment of FIG. 10, as seen respectively along the lines 11a—11a and 11b—11b thereof.
Figure 11B:
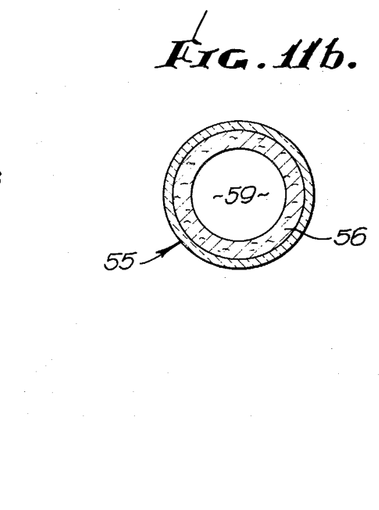

In yet another alternative embodiment shown in FIGS. 10, 11a and 11b, the interior of the inner tube 18e of the solar cell 10e may itself comprise a "heat pipe" of the type described per se in the article entitled "The Heat Pipe" by K. T. Feldman, Jr. and G. H. Whiting in the magazine *Mechanical Engineering*, Feb. 30, 1967. Such a heat pipe utilizes a porous material such as steel wool or cotton on the inside surface of the pipe. A liquid is placed in the pipe and the ends sealed. If the pipe is heated at one end, the liquid will boil. The vapor condenses at the other end of the pipe, and returns to the first end via capillary action in the porous material. The result is self-contained heat transfer system of optimum efficiency.

Such a heat pipe configuration advantageously is employed to prevent excessive heating of the inventive tubular solar cell 10e, which heating could cause degradation in the cell performance and output, or could reduce its useful lifetime. To this end, the interior surface of the inner cell tube 18e (FIG. 11a) is provided with a liner 53 of porous material such as steel wool or cotton. The interiors 54 of the cells 10e in the concentrator 16' are in fluid communication with a heat transfer end tube 55. This tube 55, which has a liner 56 of porous material, has a coiled section 55a that is situated in a heat transfer tank 57. The end 55b of the tube 55 is closed, as is the far end (not shown) of the last solar cell 10e in the set that is in fluid communication with the heat transfer tube 55.

A fluid 58 is contained in the interior space 54 of the tubular cells 10e. As the focused sunlight causes the temperature of the cells 10e to rise, the fluid 58 likewise will heat up, eventually reaching its boiling point. The fluid 58 then will vaporize, and since it is a closed system, the vapor will flow to the portion of the system that is not heated, namely the interior 59 (FIG. 11b) of the heat transfer tube 55. Since the tube 55 is at a cooler temperature, the vapor condenses on and within the porous liner 56. The condensed vapor then is transported back to the interior of the cell inner tubes 18e by means of capillary action within the porous liners 53 and 56. This vapor return may be gravity assisted by sloping the common axis of the tubes 10e slightly, and situating the heat transfer tube 55 at the high end.

This circulation very efficiently transfers heat from the individual solar cells 10e to the tube 55. This heat energy can be utilized by submerging the coil 55a in water or other liquid 60 contained within the tank 57. The heat will be transferred to the water 60, and the heated water in turn can be utilized by an external system (not shown) that is connected via an inlet 61 and an outlet 62. Note that the tank 57 serves as a heat sink for the heat pipe system.

The temperature at which the cells 10e are maintained by this "heat pipe" thermal transfer system will depend primarily on the boiling point of the fluid 54 that is used. For example, if this fluid 54 is water, the cells 10e will be maintained at about 100° C. Alternatively, with ammonia as the fluid 10e, sub-zero temperatures can be maintained.

Intending to claim all novel useful and unobvious features shown or described, the applicants claim:

1. A solar cell comprising:
   a first optically transmissive tubular support member, and
   a photovoltaic cell disposed on the inner surface of said tubular support member and comprising a radially inner electrically conductive layer, a radially intermediate layer containing a photovoltaic junction, and an outer electrically conductive but optically transmissive layer.

2. A solar cell comprising;
   an optically transmissive outer tubular member,
   an inner tubular member concentric with said outer tubular member,
   a photovoltaic cell disposed between said concentric members on a surface of one of said members, said cell comprising an inner electrically conductive layer, a radially intermediate layer containing a photovoltaic junction, and a radially outer electrically conductive but optically transmissive layer, and a closure at each end of said concentric tubular members to seal hermetically the annular space between said members and containing said photovoltaic cell.

3. A solar cell according to claim 2 wherein the layers of said cell are disposed on substantially the entire outside surface of the inner tubular member, together with electrical contacts from said conductive layers extending outwardly of both said end closures for external connection of said cell.

4. A solar cell according to claim 3 wherein each end of said cell has a pair of electrical contacts connected respectively to said cell inner and outer conductive layers so that complete electrical connection to said cell can be made from either end thereof, the contacts being disposed symmetrically to permit installation of said cell without regard for end orientation.

5. A solar cell according to claim 2 wherein said outer tubular member is transparent glass.

6. A solar cell according to claim 2 together with an optical reflector in the shape of line generated paraboloid, said cell being mounted coaxial to the axis of said paraboloid.

7. A solar cell according to claim 2 wherein said intermediate layer consists of cadmium sulfide and copper sulfide layers together comprising said photovoltaic junction.

8. A solar cell according to claim 2 wherein said intermediate layer consists of a semiconductor material containing a photovoltaic junction.

9. A solar cell according to claim 8 wherein said semiconductor material is grown in situ, and wherein said tubular surface is treated to promote oriented crystalline growth of said semiconductor material.

10. A solar cell according to claim 2 wherein said outer layer comprises a metal film grid.

11. A solar cell according to claim 2 wherein the inner tubular member comprises one part of a "heat pipe".

12. A solar cell according to claim 11 wherein said innner tubular member is in fluid communication with a heat transfer tube that comprises the other part of said "heat pipe", the inner surfaces of said inner tubular member and of said heat transfer pipe both having a lining of porous material, the ends of said "heat pipe" being closed, there being a fluid within said "heat pipe".

13. A solar cell according to claim 12 wherein said heat transfer tube has a heat sink.

14. A solar cell according to claim 2 together with a single electrical terminal at each end, said terminals being connected respectively to said inner and outer electrically conductive layers.

15. A solar cell according to claim 2 wherein at least one end of said inner tubular member is open to permit fluid flow from the interior thereof, together with;

heat transfer means, connected to an open end of said inner tubular member, for transferring heat from said solar cell via a fluid flowing through the interior of said inner tubular member.

16. A tubular solar cell comprising:

a pair of concentric tubes, at least the outer of said tubes being optically transmissive, end closures sealing said tubes to form a hermetically sealed annular space between said tubes, a photovoltaic junction covering substantially the entire surface of one of said tubes within said sealed annular space between said tubes, and consisting of a radially inner electrically conductive film, a junction layer and a radially outer optically transmissive but electrically conductive film, said films providing electrical contact to said junction layer, and electrical terminals at the ends of said tubes, the terminals being connected to said inner and outer films.

17. A solar cell according to claim 16 wherein the inner tube is hollow and open at its ends to permit a coolant fluid to flow therethrough.

18. A plurality of solar cells according to claim 16 together with a reflector in the configuration of a line generated paraboloid, said cells being aligned coaxially with the focal axis of said paraboloidal reflector.

19. A solar cell according to claim 16 wherein said junction layer comprises oriented crystalline semiconductor material containing a p-n junction.

20. A solar cell according to claim 19 wherein said inner film comprises minute semiconductor islands in a metal matrix, said islands being growth centers for the crystalline semiconductor material of said junction layer.

21. A solar cell according to claim 20 wherein said inner film has a wave-like surface.

22. A solar cell according to claim 16 wherein there are a pair of electrical terminals at each end of said tubes, the terminals in each pair being connected respectively to said inner and outer films so that complete contact can be made to said photovoltaic junction from either end of said cell, said terminals being symmetrically disposed.

23. A solar cell according to claim 16 wherein said outer film comprises a metal film grid.

24. A solar cell according to claim 16 wherein the inner tube is part of a "heat pipe".

25. A solar cell comprising:

an optically transmissive outer tubular member,
an inner tubular member concentric with said outer member,
a closure at each end of said concentric tubular members to seal hermetically the annular space between said members,
a photovoltaic cell disposed over substantially the entire surface of one of said member inside said hermetically sealed annular space, said cell comprising a radially inner electrically conductive layer, an intermediate layer containing a photovoltaic junction, and a radially outer electrically conductive but optically transmissive layer,
each end of said solar cell having a pair of external electrical contacts connected respectively to said inner and outer conductive layers so that complete electrical connection can be made from either end thereof, the contacts being disposed symmetrically to permit installation of said solar cell without regard for end orientation.

26. A solar cell according to claim 25 wherein said intermediate layer consists of a semiconductor material containing a photovoltaic junction.

27. A solar cell useful for solar-to-electrical energy conversion comprising:

a tubular support member, and a photovoltaic cell disposed on the outer surface of said tubular support member and comprising a radially inner electrically conductive layer, a radially intermediate layer containing a photovoltaic junction, and an outer electrically conductive but optically transmissive layer, said photovoltaic cell producing an output potential upon exposure to light.

28. A solar cell according to claim 27 together with an optical reflector in the shape of a line generated paraboloid, said cell being mounted coaxial to the axis of said paraboloid.

29. A solar cell comprising:

a tubular support member, a photovoltaic cell disposed on the outer surface of said tubular support member and comprising a radially inner electrically conductive layer, an intermediate layer containing a photovoltaic junction, and a radially outer electrically conductive but optically transmissive layer, and heat transfer means for establishing fluid communication with the interior of said tubular support member to effectuate heat transfer from said solar cell via a fluid flowing through said interior.

30. A solar cell according to claim 29 further comprising an outer, optically transmissive tube surrounding and concentric with said tubular support member, and end closures for maintaining said tubular support member and said outer tube in spaced concentric relationship and for hermetically sealing the annular space therebetween, said photovoltaic cell being within said hermetically sealed space.

31. A series of solar cells for solar-to-electrical energy conversion, comprising:

a set of cells, each cell comprising:
  a. an optically transmissive outer tubular member,
  b. an inner tubular member concentric with said outer tubular member,
  c. a photovoltaic cell disposed between said concentric members on a surface of one of said members, said cell comprising a radially inner electrically conductive layer, an intermediate layer containing a photovoltaic junction, and a radially outer electrically conductive but optically transmissive layer, and
  d. a closure at each end of said cell to seal hermetically the annular space between said members and containing said photovoltaic cell while leaving the ends of said inner tubular member open, and means supporting said cells in substantial axial alignment with the inner tubular members serially registering with adjacent tubular members for circulation of coolant fluid through said cells.

\* \* \* \* \*